(12) United States Patent
Lee (10) Patent No.: US 6,638,114 B2
(45) Date of Patent: Oct. 28, 2003

(54) SECTIONAL CONNECTOR SUBSTITUTING FOR PC104 AND PC104 PLUS INDUSTRIAL COMPUTER CONNECTORS

(76) Inventor: Chuen-Mao Lee, 4F., No. 405, Sec. 4, Renai Rd., Daan Chiu, Taipei City (TW)

( * ) Notice: Subject to any disclaimer, the term of this patent is extended or adjusted under 35 U.S.C. 154(b) by 114 days.

(21) Appl. No.: 09/932,939

(22) Filed: Aug. 21, 2001

(65) Prior Publication Data

US 2003/0040226 A1 Feb. 27, 2003

(51) Int. Cl.[7] ............................................. H01R 13/502
(52) U.S. Cl. ...................................... 439/701; 439/717
(58) Field of Search ................................ 439/701, 715, 439/716, 717, 876, 83

(56) References Cited

U.S. PATENT DOCUMENTS

| | | | | |
|---|---|---|---|---|
| 4,612,602 A | * | 9/1986 | Weyer et al. ............... 361/730 |
| 5,104,341 A | * | 4/1992 | Gilissen et al. ............ 439/608 |
| 5,443,404 A | * | 8/1995 | Matsuoka .................. 439/717 |
| 5,904,598 A | * | 5/1999 | Yamanashi ................ 439/701 |
| 5,951,306 A | * | 9/1999 | Millhimes ................... 439/79 |
| 6,010,373 A | * | 1/2000 | Donahue .................... 439/717 |
| 6,179,650 B1 | * | 1/2001 | Chih-Kai ................. 439/540.1 |
| 6,264,501 B1 | * | 7/2001 | Hung et al. .............. 439/541.5 |
| 6,431,920 B1 | * | 8/2002 | Endres et al. ............... 439/717 |

* cited by examiner

Primary Examiner—Lynn Feild
Assistant Examiner—Thanh-Tam Le (57) ABSTRACT

A sectional connector includes a main connector having pins in two rows, one or more first sub-connector having pins in one row, and a second sub-connector having pins in one row, sequentially connected through engagement of dovetail grooves and dovetail tenons correspondingly provided on side surfaces of the main connector and the sub-connectors in contact with one another. The sectional connector may substitute for conventional PC104 and PC104 PLUS industrial computer connectors having pins in 2+2 rows and pins in 2+2+4 rows, respectively, for connecting buses. Number of the first sub-connectors used in forming the sectional connector could be changed, depending on actual need in designing an industrial computer. The sectional connector enables easy and firm connecting and soldering of pins to a PC board row by row.

5 Claims, 14 Drawing Sheets

(PRIOR ART)
Fig.1

(PRIOR ART)

SECTIONAL CONNECTOR SUBSTITUTING FOR PC104 AND PC104 PLUS INDUSTRIAL COMPUTER CONNECTORS

BACKGROUND OF THE INVENTION

The present invention relates to a connector for industrial computers, and more particularly to a sectional connector substituting for conventional PC104 and PC104 PLUS industrial computer connectors, so that such conventional connectors may be formed by assembling a main connector having two rows of pins and at least two sub-connectors each having one row of pins through coupling means correspondingly provided on the main connector and the sub-connectors. The number of the sub-connectors in the sectional connector may change depending on actual need in designing the industrial computer, and easy and firm connecting and soldering of the pins to a printed circuit board row by row is possible with the sectional connector.

Computer-related technologies have been prosperously developed in the world. Computer manufacturers keep researching, developing and improving various kinds of computer-related components, from a simple screw to a high-power central processing unit (CPU), in attempts to upgrade the quality of computers and reduce the manufacturing cost to be competitive in the international markets.

Computers are usually differently designed to meet actual needs in different fields. For example, an industrial computer requires a CPU that needs not to operate at high speed but to work stably in compliance with preset steps to achieve a projected productivity. The Institute of Electrical and Electronic Engineers (IEEE) has established some basic standards for industrial computers and connectors for connecting buses. The main purposes of these standards for connectors are to enable automatic permutation, stack, and employment of connectors in computer designs and to reduce number of coupling elements in the motherboard.

A connector corresponding to PC104 specification is typically used to connect general buses and is an assembly of a connector having total 64 pins in two rows and a connector having total 40 pins in two rows. A connector corresponding to PC104 PLUS specification is typically used to connect high-speed Peripheral Component Interconnect (PCI) buses and is an assembly of a connector having total 64 pins in two rows, a connector having total 40 pins in two rows, and a connector having total 120 pins in four rows. When the conventional PC104 or PC104 PLUS connector assembled from at least two connectors is inserted onto a printed circuit (PC) board, the numerous pins in so many rows cause difficulty in soldering the pins to the PC board to result in high labor and time costs, making the PC104 and PC104 PLUS connectors not economical for use.

Figure 1:
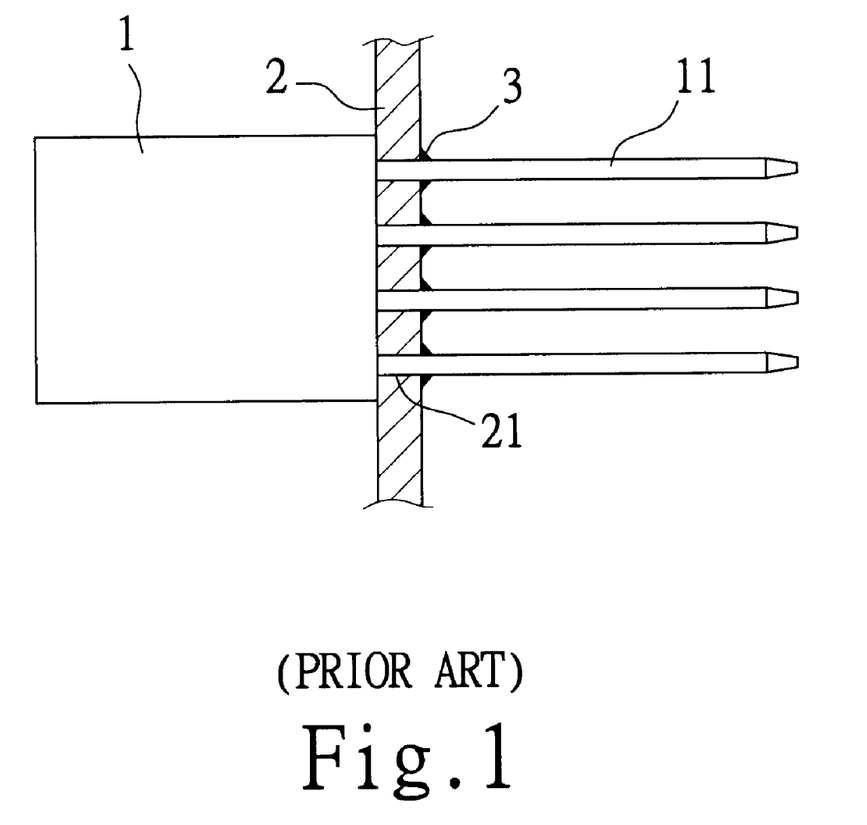
FIG. 1 is a partially sectioned side view showing the soldering of a conventional connector to a circuit board.

FIG. 1 is a partially sectioned side view showing the soldering of a conventional connector 1 having pins 11 in four rows to a PC board 2. As shown in FIG. 1, the connector 1 is connected to the PC board 2 by extending the pins 11 through holes 21 on the PC board 2 and then spot soldering each joint of the pin 11 and the hole 21 with a solder iron (not shown) and tin solder 3. It is most preferable the tin solder molten around each hole 21 finally forms a volcanic shape, so as to avoid poor contact between the hole 21 and the pin 11 due to cold or hollow soldering. However, it is obviously a time and labor consuming and highly difficult technical work to spot solder pins 11 in more than two rows. For example, the connector 1 has total 64 pins in four rows. It is easy to solder the pins 11 in two outer rows but not the pins 11 in two inner rows. A solder iron might be too thick to pass clearances among the pins 11 to perform the soldering. Moreover, the solder iron in high temperature would very possibly adversely affect the tin solder 3 that has been previously soldered around the holes 21 to cause cold and hollow soldering and/or short circuit between two pins 11.

Figure 2:
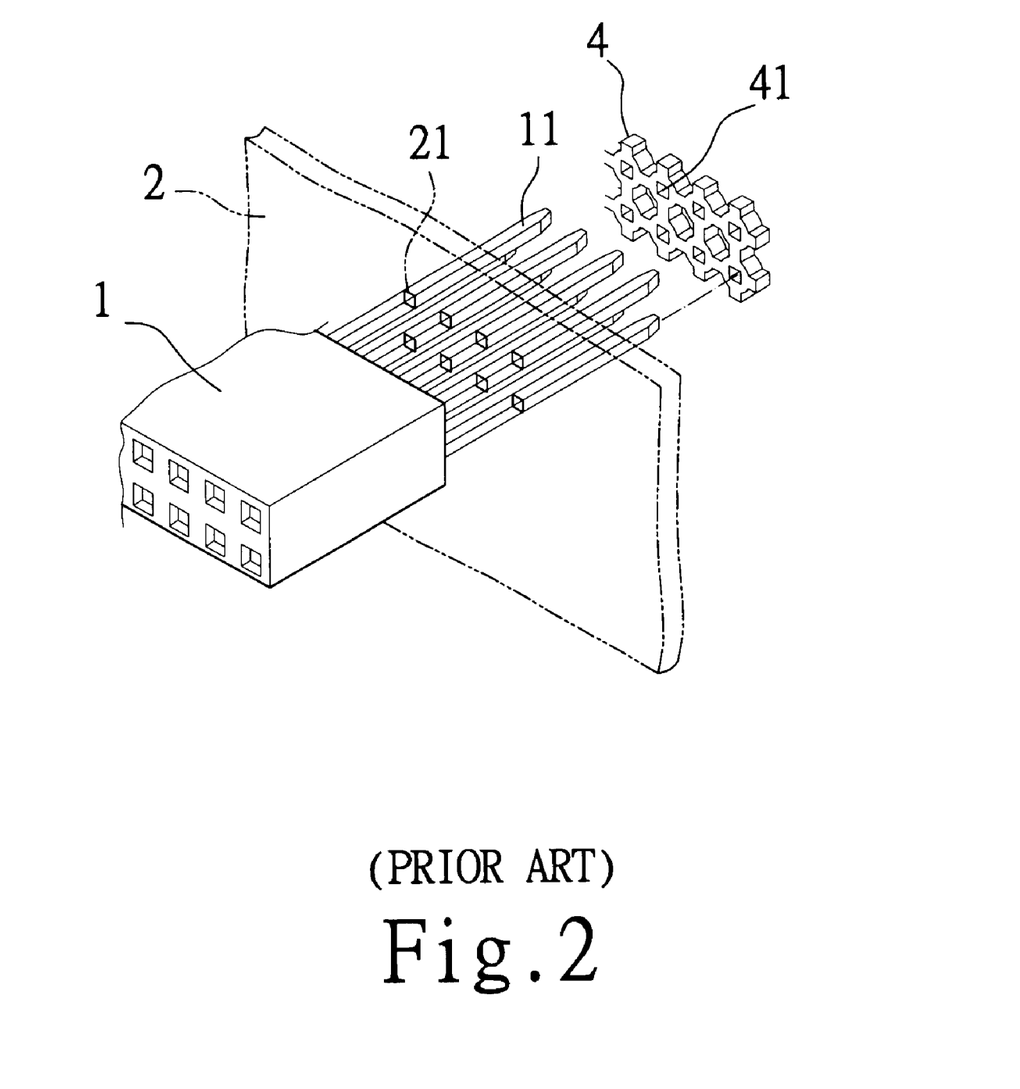
FIG. 2 schematically shows the soldering of a conventional connector to a circuit board through a solder tin sheet.

To overcome the problem of difficult spot soldering on the connector 1 having a plurality of pins 11 in too many rows, there is developed a soldering tin sheet 4 having a plurality of through holes 41 corresponding to the pins 11 of the connector 1 to replace the spot soldering. As can be seen in FIG. 2, the pins 11 of the connector 1 are extended through the holes 41 on the soldering tin sheet 4 and the holes 21 on the PC board 2, and a hot blast heater (not shown) is used to blow at the soldering tin sheet 4 to and fro, so that the soldering tin sheet 4 melts at joints of the pins 11 and the holes 21. For a PC board 2 having surface-mounting devices (SMD), such tin-melting with a hot blast heater over a large area tends to cause not only cold soldering, hollow soldering, and short circuit between pins 11, but also undesired melting of tin solder at initially soldered electronic devices. When the molten tin solder at the previously soldered electronic devices become set again, it would result in the problems of cold soldering, hollow soldering, and short circuit between pins.

Figure 3:
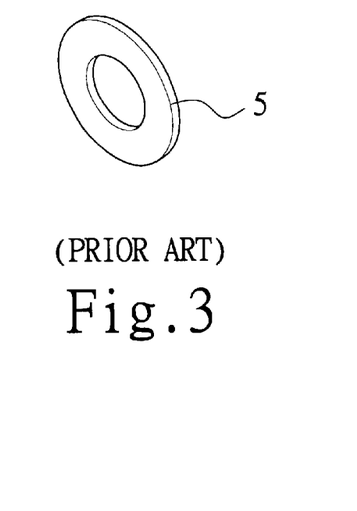
FIG. 3 shows a washer used with a conventional connector.
Figure 4:
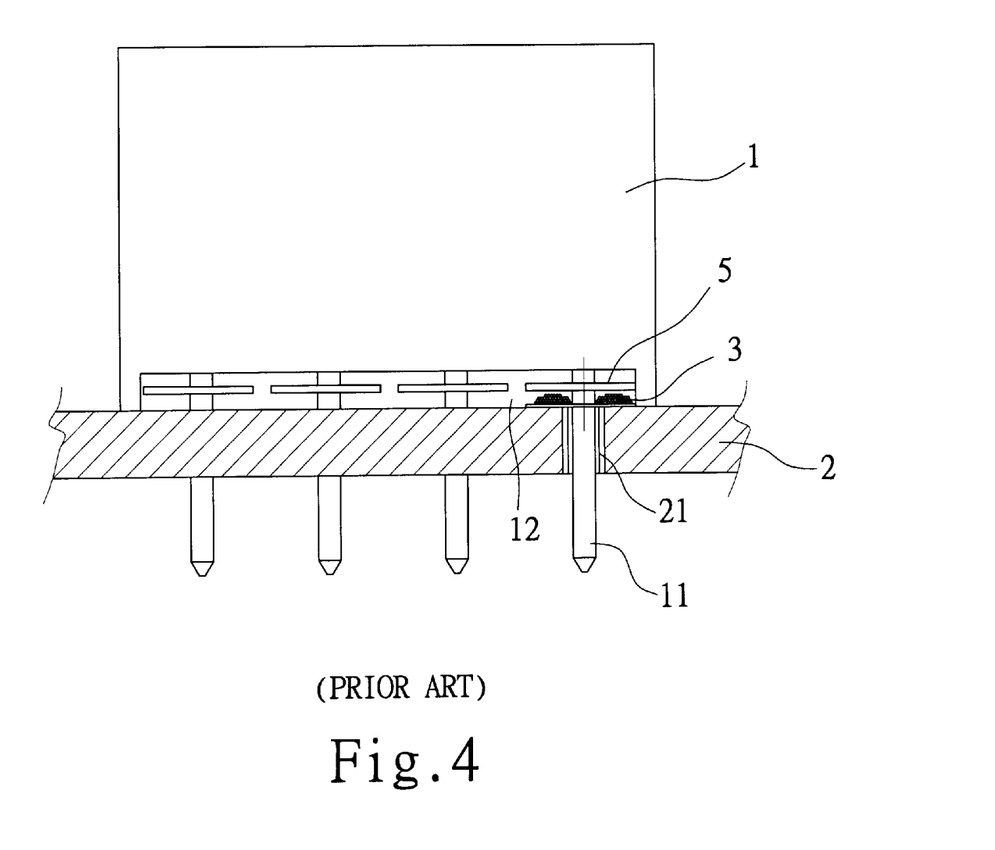
FIG. 4 is a partially sectioned side view showing the conventional connector is connected to a circuit board through washers and tin solder.

As shown in FIG. 4, the connector 1 has a bottom recess 12 in which the pins 11 are provided. The recess 12 defines a space between the connector 1 and the PC board 2. For the pins 11 and the holes 21 to fully connect at their joints, a layer of tin solder 3 is applied on the surface of the PC board 2 facing the recess 12, and a washer 5 as shown in FIG. 3 is mounted around each pin 11 in the recess 12, and finally, a hot blast heater is used to blow at the tin solder layer 3 to and fro, so that the tin solder 3 melts at the joints of the holes 21 and the pins 11. As mentioned above, such melting of tin solder over a large area tends to result in serious cold soldering, hollow soldering, and short circuit between pins, particularly in an invisible space. Thus, the problems existing in the conventional connector 1 are not overcome at all.

Figure 5:
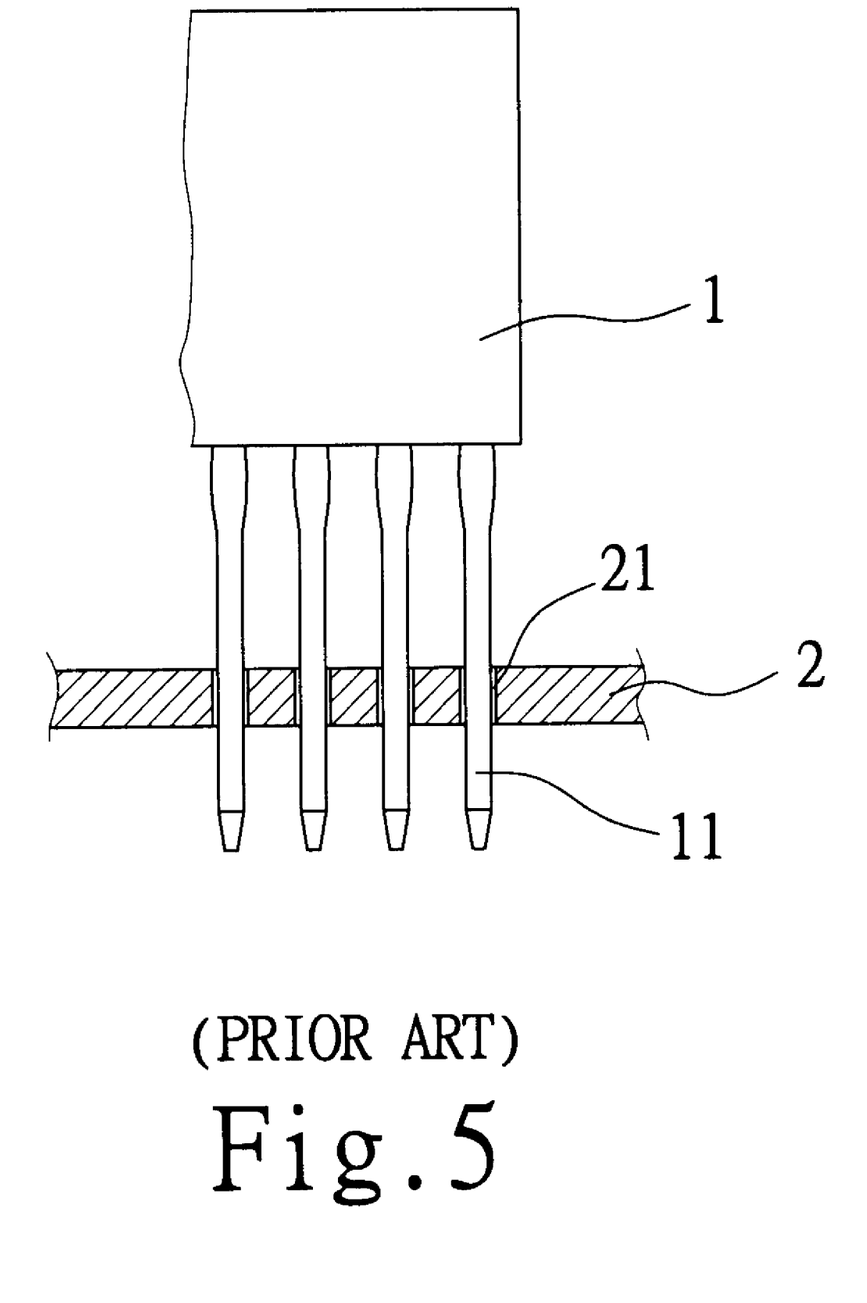
FIG. 5 is a partially sectioned side view showing another conventional connector is half connected to a circuit board.
Figure 6:
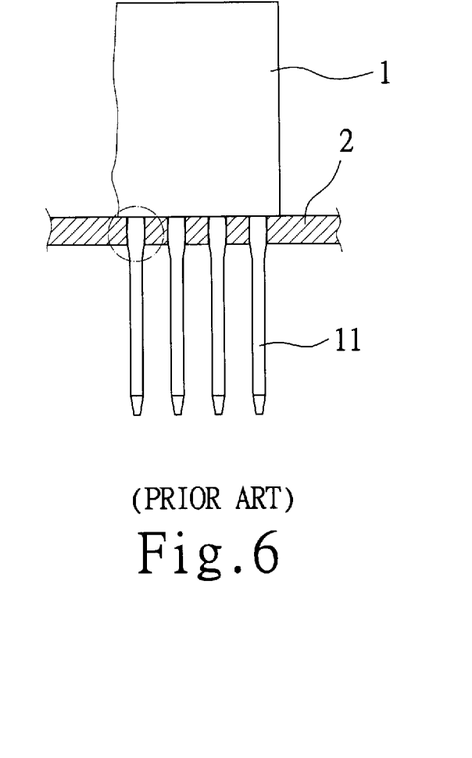
FIG. 6 is a partially sectioned side view showing the conventional connector of FIG. 5 has been completely forced onto the circuit board.
Figure 7:
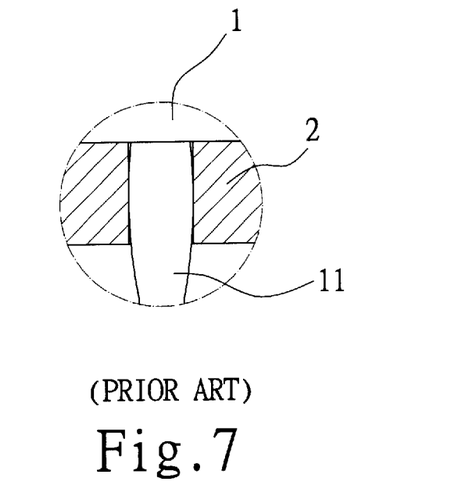
FIG. 7 is a fragmentary and enlarged view of FIG. 6 showing the conventional connector is tightly connected to the circuit board at a widened root of each pin on the connector.

In FIGS. 5, 6 and 7, there is shown another type of conventional connector 1, pins 11 of which have a uniform width at all portions except for a small length at roots of the pins 11 that is wider than other portions. When the another type of conventional connector 1 is inserted onto the PC board 2 by extending the pins 11 through the holes 21, the widened roots of the pins 11 are stopped before the holes 21 and must be forced into the holes 21 by applying a pressure on the connector 1, so that the connector 1 is completely tightly associated with the PC board 2. It is known that the connector 1 is used to detachably connect buses. The above-described manner of forcing the connector 1 onto the PC board 2 would possibly cause undesired separation of the buses from the connector 1.

It is therefore desirable to develop an improved connector to substitute for the conventional PC104 and PC104 PLUS industrial computer connectors to solve the problems in soldering the pins of the connectors to the PC board.

SUMMARY OF THE INVENTION

A primary object of the present invention is to provide a sectional connector substituting for conventional PC104 and PC104 PLUS industrial computer connectors to enable easy and firm connecting and soldering of pins of the connector to a PC board.

Another object of the present invention is to provide a sectional connector for industrial computer that includes a main connector and a plurality of sub-connectors, the number of which is dependent on actual needs in designing industrial computers, connected to one another through coupling means provided on contact surfaces between two adjacent main connector and sub-connector or two adjacent sub-connectors.

A further object of the present invention is to provide a sectional connector for industrial computer that has completely even and smooth outer surfaces after being assembled from at least a main connector and a sub-connector.

To achieve the above and other objects, the sectional connector of the present invention mainly includes a main connector having pins in two rows, one or more first sub-connector having pins in one row, and a second sub-connector having pins in one row, sequentially connected through engagement of dovetail grooves and dovetail tenons correspondingly provided on side surfaces of the main connector and the sub-connectors in contact with one another. The sectional connector may substitute for PC104 and PC104 PLUS industrial computer connectors having pins in 2+2 rows and pins in 2+2+4 rows, respectively, for connecting buses. Number of the first sub-connectors used in forming the sectional connector may be changed, depending on actual need in designing an industrial computer. The sectional connector enables easy and firm connecting and soldering of pins to a PC board row by row.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 8:
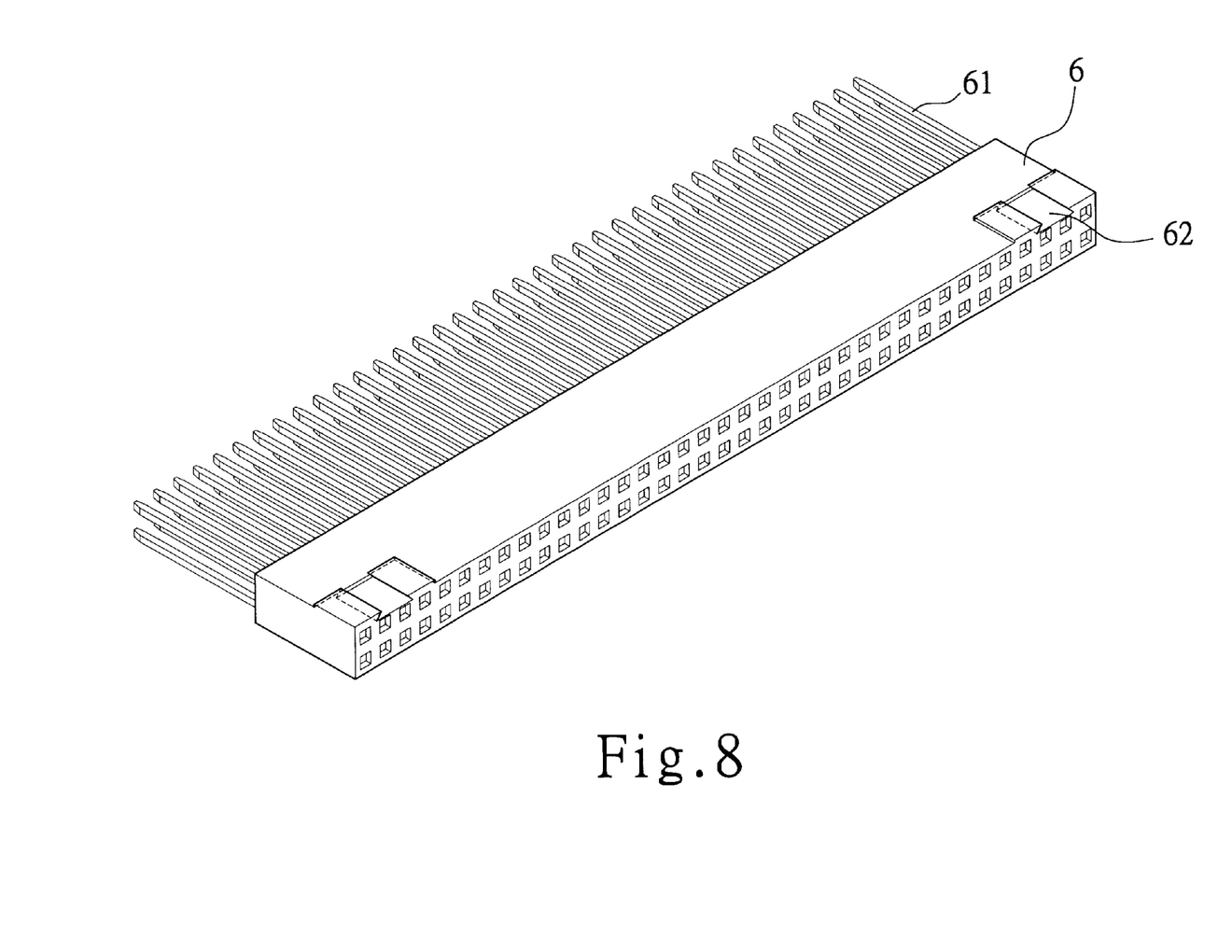
FIG. 8 is a perspective view schematically showing the structure of a main connector according to the present invention.
Figure 9:
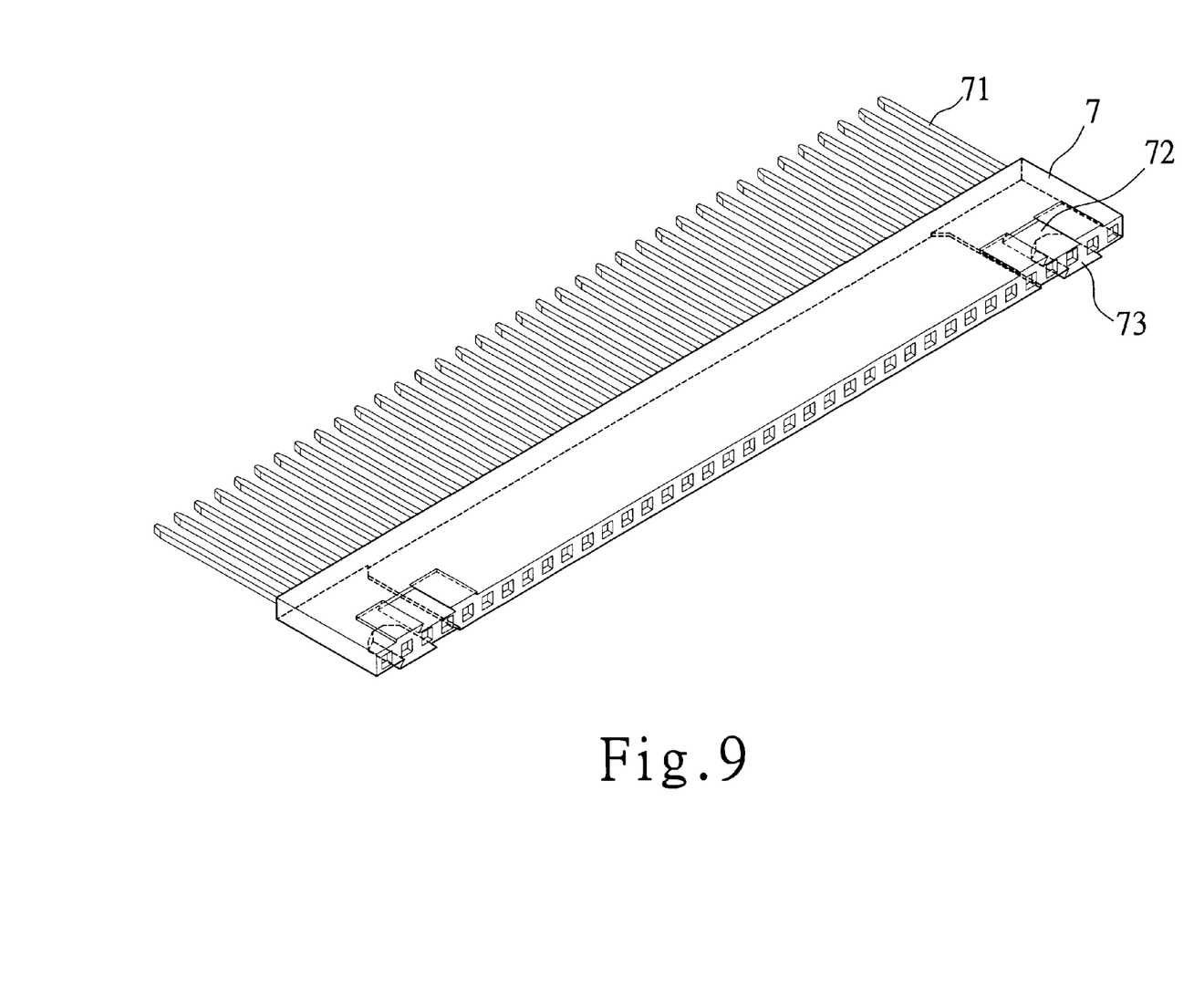
FIG. 9 is a perspective view schematically showing the structure of a first sub-connector according to the present invention.
Figure 10:
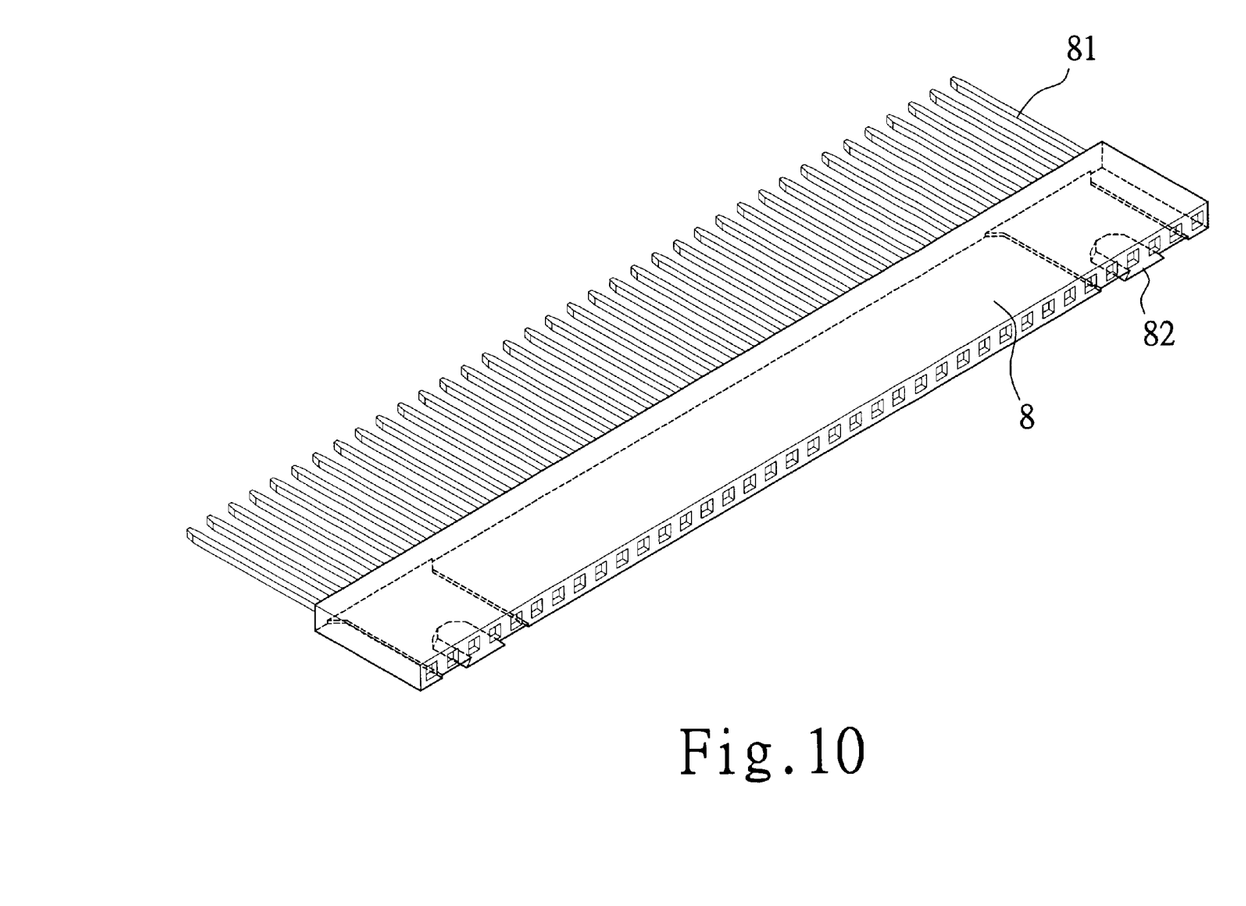
FIG. 10 is a perspective view schematically showing the structure of a second sub-connector according to the present invention.

Please refer to FIGS. 8, 9 and 10 that show a main connector 6, a first sub-connector 7, and a second sub-connector 8, respectively, according to the present invention for assembled into a sectional connector substituting for conventional PC104 and PC104 PLUS connectors for industrial computer.

As shown in FIG. 8, the main connector 6 includes a plurality of pins 61 in two rows, and is provided on one of its two side surfaces at two outer corners with two dovetail grooves 62.

The first sub-connector 7 shown in FIG. 9 includes one row of pins 71, and is provided on a first side surface at two outer corners with two dovetail tenons 73 corresponding to and engaging with the two dovetail grooves provided on the main connector 6, and on a second side surface opposite to the first side surface at two outer corners with two dovetail grooves 72, so that a plurality of first sub-connectors 7 may be sequentially connected to one another by engagement of the dovetail grooves 72 at the first side surface of a preceding first sub-connector 7 with the dovetail grooves 72 at the second side surface of a next first sub-connector 7.

The second sub-connector 8 shown in FIG. 10 includes one row of pins 81, and is provided on one of its two side surfaces at two outer corners with two dovetail tenons 82 corresponding to and engaging with the dovetail grooves 72 provided on the first side surface of the first sub-connector 7.

It is also possible to provide two dovetail tenons on the side surface of the main connector 6 and two dovetail grooves on the side surface of the second sub-connector 8, so that the main connector 6 and the second sub-connector 8 always have two complementary side surfaces that face toward each other. As can be seen from FIGS. 11, 12 and 13, the main connector 6 and the first sub-connector 7, and the first and the second sub-connectors 7, 8 are connected to each other through engagement of the dovetail grooves 62 with the dovetail tenons 73 and the dovetail grooves 72 with the dovetail tenons 82, respectively, so that two adjacent side surfaces between the main connector 6 and the first sub-connector 7 and between the first and the second sub-connectors 7, 8 always tightly and smoothly contact with one another to provide a fully assembled connector having smooth contact surfaces and even outer surfaces, as shown in FIG. 13.

Such dovetail joints, that is, joints formed from complementary dovetail grooves and tenons, may be provided on two adjacent side surfaces between the main connector 6 and the first sub-connector 7 and between the two sub-connectors 7, 8 at any suitable positions instead of being symmetrically provided at two outer corners.

Figure 11:
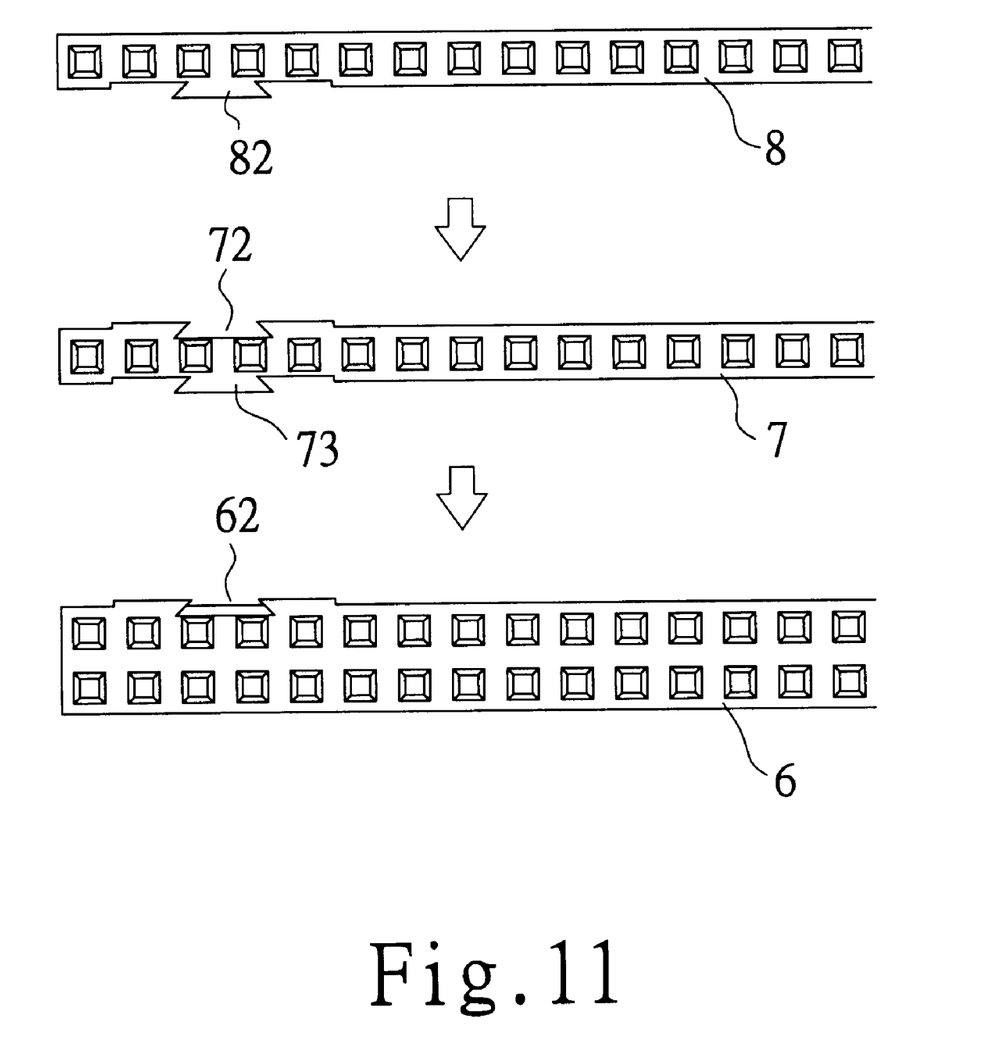
FIG. 11 is a plan view showing the main connector and the two sub-connectors of the present invention are to be sequentially connected to one another.
Figure 12:
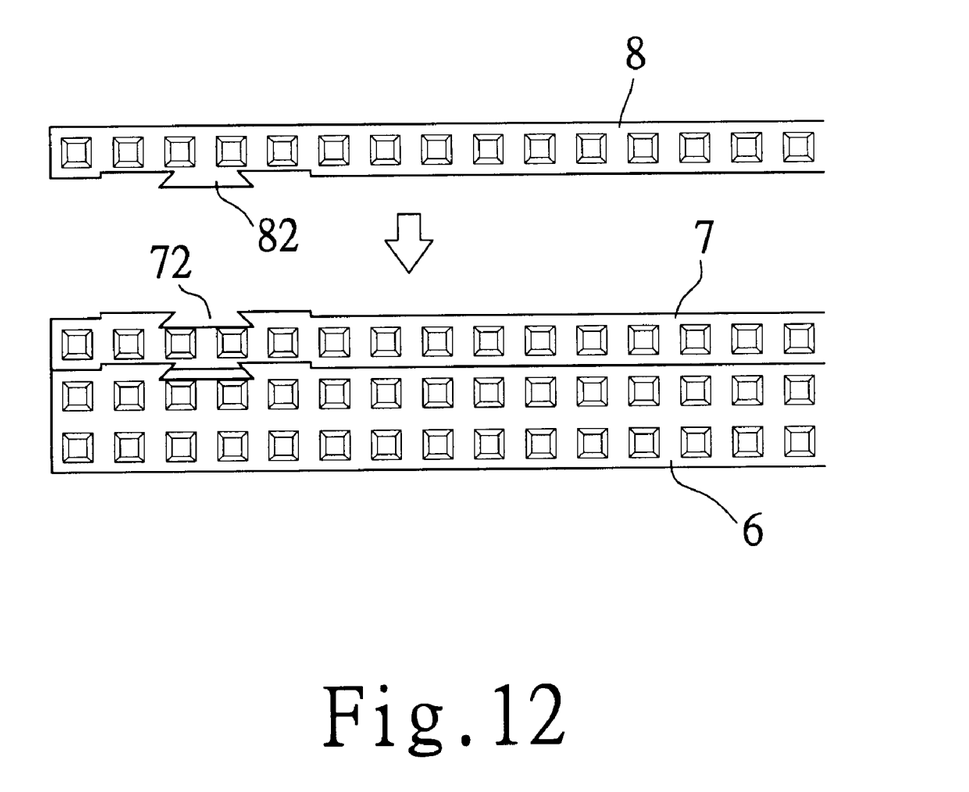
FIG. 12 is a plan view showing the first sub-connector has been connected to the main connector of the present invention.
Figure 13:
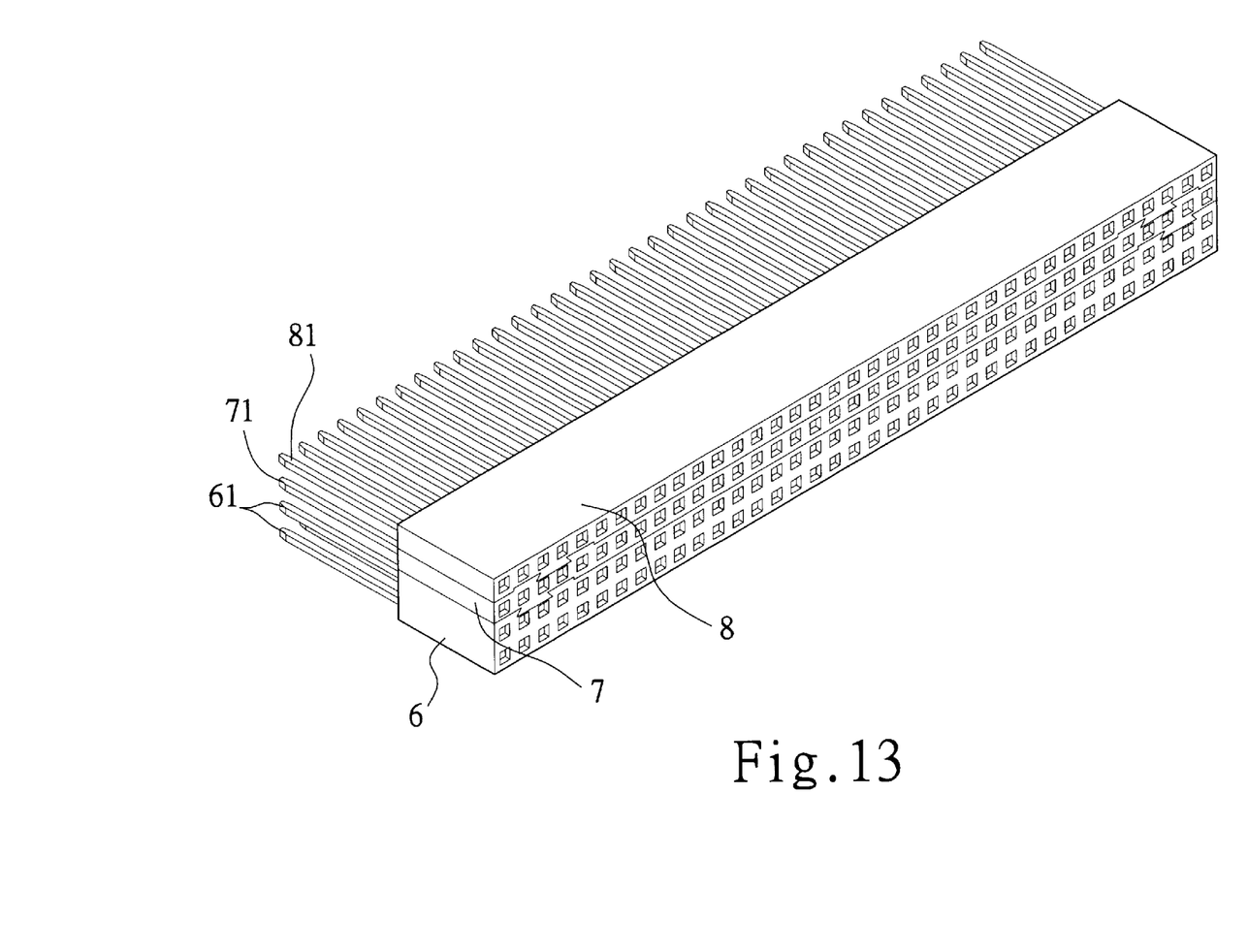
FIG. 13 is a perspective view of a sectional connector of the present invention assembled from one main connector and two sub-connectors.

By sequentially connecting one piece of the main connector 6, one piece of the first sub-connector 7, and one piece of the second sub-connector 8 to one another in the manner shown in FIGS. 11 and 12, the completely assembled connector shown in FIG. 13 has a plurality of pins in 2+1+1 rows that could be sequentially and separately connected and soldered to a circuit board row by row to overcome the problems in soldering that would usually be encountered in connecting the conventional connector 1 to the circuit board 2 through spot soldering.

Figure 14:
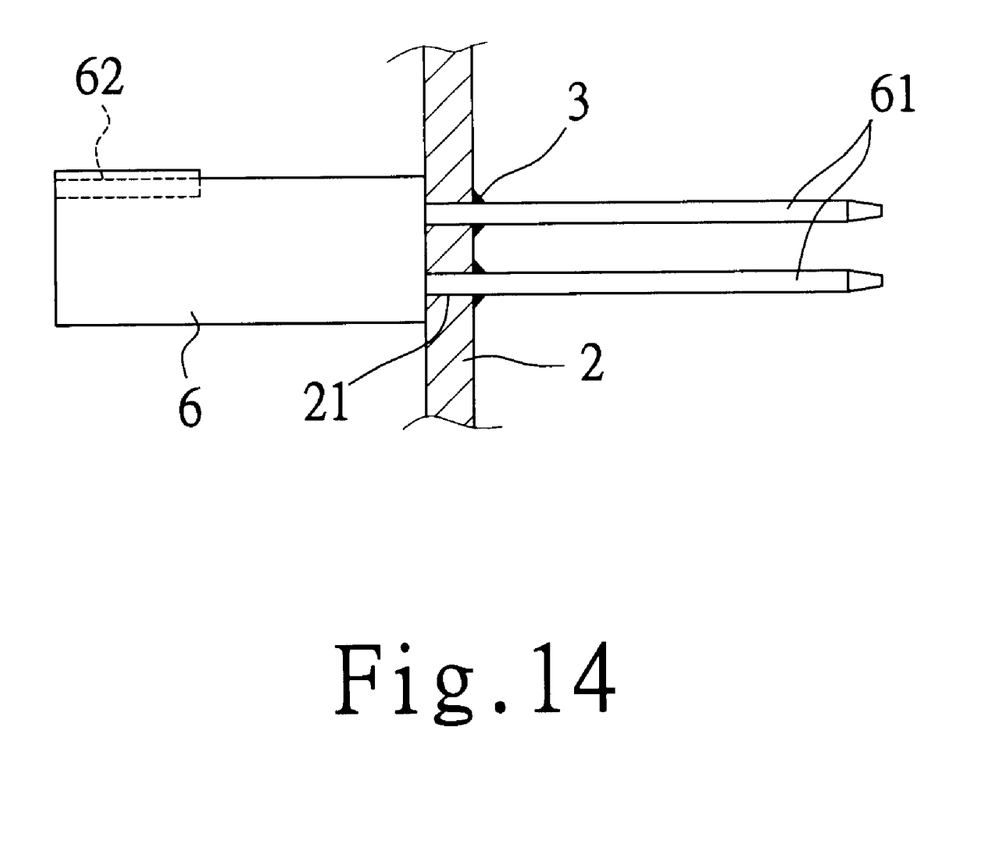
FIG. 14 is a partially sectioned side view showing the soldering of the main connector of the present invention to a circuit board.
Figure 15:
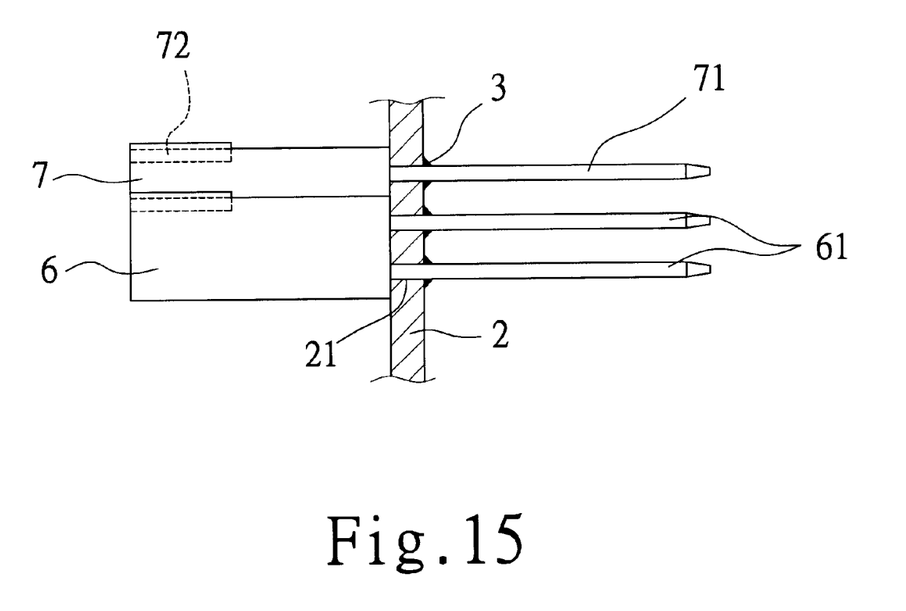
FIG. 15 is a partially sectioned side view showing the first sub-connector of the present invention is connected to the main connector and soldered to the circuit board.
Figure 16:
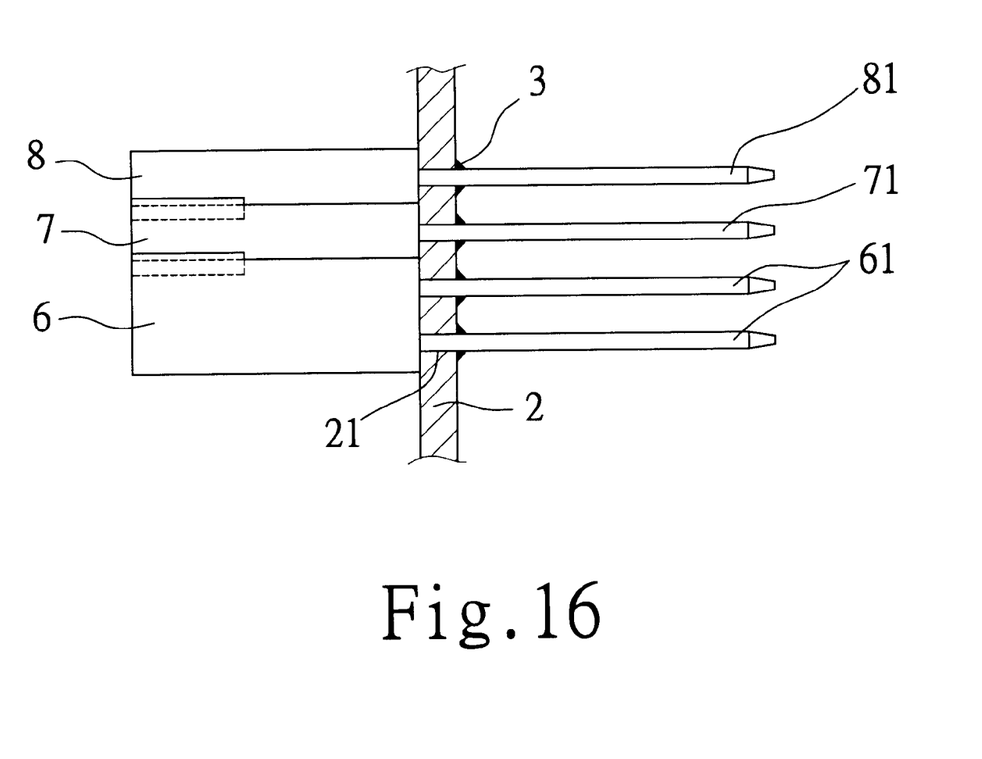
FIG. 16 is a partially sectioned side view showing the second sub-connector of the present invention is connected to the first sub-connector and soldered to the circuit board.

Taking the forming of a sectional connector substituting for a PC104 connector as an example, one piece of the main connector 6 is first connected to a printed circuit (PC) board 2 by extending 64 pins 61 in two rows through two rows of through holes 21 formed on the PC board 2, and joints of the pins 61 and the through holes 21 are then spot soldered by using a solder iron (not shown) to melt tin solder 3 around the joints, as shown in FIG. 14. After all 64 pins 61 in two rows on the main connector 6 have been sequentially soldered to the through holes 21 on the PC board 2, one piece of the first sub-connector 7 is connected to the PC board 2 by extending one row of 20 pins 71 through another row of through holes 21 on the PC board 2 with the dovetail tenons 73 engaged with the dovetail grooves 62 on the main connector 6. Thereafter, joints of the pins 71 and the through holes 21 are sequentially soldered. Finally, one piece of the second sub-connector 8 is connected to the PC board 2 by extending one row of 20 pins 81 through a further row of through holes 21 on the PC board 2 with the dovetail tenons 82 engaged with the dovetail grooves 72 on the first sub-connector 7, and joints of the pins 81 and the through holes 21 are sequentially soldered. It is preferable the tin solder 3 molten around each joint finally forms into a volcanic shape, so that problems of poor contact between the pins 61, 71 and 81 and the through holes 21 caused by cold welding or hollow welding could be avoided.

With the dovetail joints provided on the main connector 6 and the sub-connectors 7 and 8, it is also possible to provide a sectional connector corresponding to PC104 PLUS specification through assembling a sectional connector corresponding to PC104 specification connector formed in the above-described manner and having total 104 pins in 2+1+1 rows, a sectional connector corresponding to PC104 PLUS specification connector and having total 120 pins in 2+1+1 rows, and a Peripheral Component Interconnect (PCI). Or, a plurality of the sub-connectors 7, 8 may be sequentially connected one by one, depending on actual need in designing an industrial computer. Since the main connector 6 and the sub-connectors 7, 8 are connected to the PC board 2 one by one, pins 61, 71, 81 on these connectors could be easily and firmly soldered to the PC board 2 row by row.

The following are some advantages of the present invention attributable to its unique structure and assembling manner:

1. A sectional connector corresponding to PC104 or PC104 PLUS specification for industrial computer may be formed through assembling the main connector 6 and the first and the second sub-connectors 7, 8 via the dovetail joints, so that 2+1+1 rows of pins 61, 71, 81 of the final connector could be sequentially connected and soldered to the PC Board 2 row by row to enable easy and firm soldering thereof. The problems of time and labor consuming and technically difficult spot soldering required in the conventional connector are therefore effectively overcome in the present invention.

2. The forming of a sectional connector substituting for PC104 and/or PC104 PLUS connector for industrial computer as mentioned in the above paragraph 1 also effectively overcomes the problems of cold and/or hollow soldering joints as well as short circuit between pins caused by melting soldering tin sheet with a hot blast heater as encountered in the conventional connector.

3. The sectional connector substituting for conventional PC104 and PC104 PLUS industrial computer connectors is formed from the main connector 6 and the sub-connectors 7, 8 through the dovetail joints of dovetail grooves and dovetail tenons and has tight and smooth contact surfaces between any two adjacent connectors as well as even outer surfaces.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A sectional connector substituting for PC104 and PC104 PLUS industrial computer connectors, comprising a main connector having a plurality of pins in only two rows, one or more first sub-connectors, each sub-connector having a plurality of pins in only one single row, and a second sub-connector having a plurality of pins in only one single row; and coupling means correspondingly provided on two contact surfaces between said main connector and one of said first sub-connectors adjacent to said main connector, between any two of said first sub-connectors adjacent to each other, and between one of said first sub-connectors and said second sub-connector adjacent to each other; wherein said main connector, said one or more first sub-connectors, and said second sub-connector are arranged to be sequentially connected at said coupling means to form a connector corresponding to PC104 specification but having pins in 2+1+1 rows or a connector corresponding to PC104 PLUS specification but having pins in 2+1+1 and 2+1+1 rows for connecting buses, while pins on said main connector and said first and second sub-connectors are arranged to be easily and firmly connected and soldered to a printed circuit board row by row.

2. The sectional connector substituting for PC104 & PC104 PLUS industrial computer connectors as claimed in claim 1, wherein said coupling means on said main connector include two dovetail grooves provided on one of two side surfaces of said main connector at two outer corners thereof.

3. The sectional connector substituting for PC104 and PC104 PLUS industrial computer connectors as claimed in claim 2, wherein said coupling means on each said first sub-connector include two dovetail tenons provided on a first side surface of said first sub-connector at two outer corners thereof to correspond to and engage with said two dovetail grooves on said main connector, and two dovetail grooves provided on a second side surface of said first sub-connector at two outer corners thereof for engaging with two said dovetail tenons correspondingly provided on said first side surface of a next one of said first sub-connectors.

4. The sectional connector substituting for PC104 and PC104 PLUS industrial computer connectors as claimed in claim 3, wherein said coupling means on said second sub-connector include two dovetail tenons provided on one of two side surfaces of said second sub-connector at two outer corners thereof to correspond to and engage with said two dovetail grooves provided on said second side surface of each said first sub-connector.

5. The sectional connector substituting for PC104 & PC104 PLUS industrial computer connectors as claimed in claim 1, wherein said coupling means are provided on said contact surfaces at any positions thereof.

* * * * *